(12) United States Patent
Kwon et al.

(10) Patent No.: US 8,119,467 B2
(45) Date of Patent: Feb. 21, 2012

(54) METHOD OF MANUFACTURING THIN FILM TRANSISTOR SUBSTRATE AND METHOD OF MANUFACTURING ORGANIC LIGHT EMITTING DISPLAY APPARATUS

(75) Inventors: Ae-Kyung Kwon, Yongin (KR); Won-Kyu Kwak, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/699,196

(22) Filed: Feb. 3, 2010

(65) Prior Publication Data

US 2010/0255619 A1  Oct. 7, 2010

(30) Foreign Application Priority Data

Apr. 2, 2009 (KR) .................. 10-2009-0028540

(51) Int. Cl.
*H01L 21/84* (2006.01)
(52) U.S. Cl. .... 438/155; 438/23; 438/149; 257/E21.011
(58) Field of Classification Search .................. 438/23, 438/145, 161, 190; 257/E21.35, E21.351, 257/E21.352, E21.364, E21.366
See application file for complete search history.

(56) References Cited

U.S. PATENT DOCUMENTS

| | | | | |
|---|---|---|---|---|
| 2004/0219696 A1* | 11/2004 | Seo et al. | .................. | 438/20 |
| 2008/0265254 A1* | 10/2008 | Nishiura | .................. | 257/59 |
| 2010/0163866 A1* | 7/2010 | Akimoto et al. | .................. | 257/43 |

FOREIGN PATENT DOCUMENTS

| | | |
|---|---|---|
| JP | 2008-275937 | 11/2008 |
| KR | 10-0600878 B1 | 7/2006 |
| KR | 10-2006-0104219 | 10/2006 |

OTHER PUBLICATIONS

KIPO Office action dated Nov. 25, 2010, for Korean priority Patent application 10-2009-0028540, noting listed reference in this IDS.
KIPO Registration Determination Certificate dated Feb. 23, 2011, for Korean priority Patent application 10-2009-0028540, noting listed references in this IDS, as well as KR 10-2006-0104219, previously filed in an IDS dated Feb. 4, 2011.

* cited by examiner

*Primary Examiner* — Cheung Lee
(74) *Attorney, Agent, or Firm* — Christie, Parker & Hale, LLP

(57) ABSTRACT

Provided are a method of manufacturing a thin film transistor (TFT) substrate and a method of manufacturing an organic light emitting display apparatus, which increase the capacitance of a capacitor without increasing the probability of short circuits between wires. The method of manufacturing a TFT substrate includes (a) forming a capacitor electrode and a gate electrode on a substrate having a first region and a second region, so that the capacitor electrode is formed to correspond to the first region and the gate electrode is formed in a portion of the second region; (b) forming an interlayer insulating layer to cover the gate electrode and the capacitor electrode; and (c) etching a portion of the interlayer insulating layer in the first region by using a halftone mask to a thickness that is less than a thickness of a portion of the interlayer insulating layer in the second region.

13 Claims, 5 Drawing Sheets

METHOD OF MANUFACTURING THIN FILM TRANSISTOR SUBSTRATE AND METHOD OF MANUFACTURING ORGANIC LIGHT EMITTING DISPLAY APPARATUS

CROSS-REFERENCE TO RELATED APPLICATIONS

This application claims priority to and the benefit of Korean Patent Application No. 10-2009-0028540, filed in the Korean Intellectual Property Office on Apr. 2, 2009, the entire content of which is incorporated herein by reference.

BACKGROUND OF THE INVENTION

1. Field of the Invention

One or more embodiments of the present invention relate to a method of manufacturing a thin film transistor (TFT) substrate and a method of manufacturing an organic light emitting display apparatus.

2. Description of the Related Art

In general, a thin film transistor (TFT) substrate is a substrate on which TFTs are formed. In addition to the TFTs, a TFT substrate may further include components such as capacitors.

FIG. 1 is a schematic cross-sectional diagram of a TFT substrate manufactured according to a conventional TFT substrate manufacturing method.

Referring to FIG. 1, a TFT 20 and a capacitor 30 are formed on a substrate 10. A first capacitor electrode 31 of the capacitor 30 and a semiconductor layer 23 of the TFT 20 are formed in a same layer, a second capacitor electrode 32 of the capacitor 30 and a gate electrode 25 of the TFT 20 are formed in a same layer, and a gate insulating layer 11 is formed between the first and second capacitor electrodes 31 and 32 and between the semiconductor layer 23 and the gate electrode 25. An interlayer insulating layer 13 is formed on the second capacitor electrode 32 and the gate electrode 25, and source and drain electrodes 21 and 22 are formed on the interlayer insulating layer 13.

If an organic light emitting display apparatus is manufactured by using the TFT substrate illustrated in FIG. 1, since the first capacitor electrode 31 and the semiconductor layer 23 may be formed in the same layer by using the same material and the second capacitor electrode 32 and the gate electrode 25 may be formed in the same layer by using the same material, in order to obtain a voltage range sufficient to operate the capacitor 30, a circuit modification is required by, for example, connecting wires for applying electrical signals to the first and second capacitor electrodes 31 and 32 from a new wire (e.g., an electrode power supply line) instead of a conventional wire (e.g., a power supply line) of the organic light emitting display apparatus. Accordingly, defects may occur.

SUMMARY OF THE INVENTION

One or more embodiments of the present invention include a method of manufacturing a thin film transistor (TFT) substrate and a method of manufacturing an organic light emitting display apparatus, which increase the capacitance of a capacitor without increasing the probability of short circuits between wires.

Additional aspects will be set forth in part in the description which follows and, in part, will be apparent from the description, or may be learned by practice of the presented embodiments.

According to one or more embodiments of the present invention, a method of manufacturing a thin film transistor (TFT) substrate having a TFT and a capacitor, includes (a) forming a first capacitor electrode and a gate electrode on a substrate having a first region and a second region, so that the first capacitor electrode is formed to correspond to the first region and the gate electrode is formed in a portion of the second region, the first capacitor electrode and the gate electrode being formed in a same layer; (b) forming an interlayer insulating layer to cover the gate electrode and the first capacitor electrode; and (c) etching a portion of the interlayer insulating layer in the first region by using a halftone mask to a thickness that is less than a thickness of a portion of the interlayer insulating layer in the second region.

The method may further include (d) forming a second capacitor electrode and source and drain electrodes on the interlayer insulating layer so that the second capacitor electrode is formed to correspond to the first region and the source and drain electrodes form the TFT together with the gate electrode.

In one embodiment, (a) may include forming a first wire on the substrate, the first wire being formed in the same layer as the gate electrode, and (d) may include forming a second wire on a portion of the interlayer insulating layer in the second region.

The first wire may be formed concurrently with the first capacitor electrode and the gate electrode, and the second wire may be formed concurrently with the second capacitor electrode and the source and drain electrodes.

In another embodiment, (a) may include forming a patterned semiconductor layer and a gate insulating layer covering the semiconductor layer on the substrate, and then forming the first capacitor electrode and the gate electrode on the gate insulating layer.

The method may further include (d) forming a second capacitor electrode and source and drain electrodes on the interlayer insulating layer so that the second capacitor electrode is formed to correspond to the first region and the source and drain electrodes form the TFT together with the gate electrode.

In this embodiment, (a) may further include forming a first wire on the substrate, the first wire being formed in the same layer as the gate electrode, and (d) may further include forming a second wire on a portion of the interlayer insulating layer in the second region.

The first wire may be formed concurrently with the first capacitor electrode and the gate electrode, and the second wire may be formed concurrently with the second capacitor electrode and the source and drain electrodes.

In still another embodiment, (c) may include (c1) forming a photoresist layer on the interlayer insulating layer by using a halftone mask so that a thickness of a portion of the photoresist layer corresponding to the first region is less than a thickness of a portion of the photoresist layer corresponding to the second region, the photoresist layer having two exposure holes in the portion of the photoresist layer corresponding to the second region to expose portions of the interlayer insulating layer corresponding to the semiconductor layer; (c2) etching the portions of the interlayer insulating layer which are exposed by the exposure holes of the photoresist layer by a first dry etching to form holes in the interlayer insulating layer; (c3) removing the portion of the photoresist layer corresponding to the first region by ashing the photoresist layer to expose a portion of the interlayer insulating layer corresponding to the first region; and (c4) etching the portions of the interlayer insulating layer which are exposed by the exposure holes of the photoresist layer by a second dry etching so that portions of the semiconductor layer are exposed by the holes formed in the interlayer insulating layer and the gate insulating layer, and concurrently etching a part of the portion of the interlayer insulating layer corresponding to the first region, to a thickness that is less than the thickness of the portion of the interlayer insulating layer corresponding to the second region.

The method may further include (c5) removing the photoresist layer that remains on the interlayer insulating layer; and (d) forming a second capacitor electrode and source and drain electrodes on the interlayer insulating layer so that the second capacitor electrode is formed to correspond to the first region and the source and drain electrodes contact the semiconductor layer through the holes formed in the interlayer insulating layer and the gate insulating layer.

In this embodiment, (a) may further include forming a first wire on the substrate, the first wire being formed in the same layer as the gate electrode, and (d) may further include forming a second wire on a portion of the interlayer insulating layer in the second region.

The first wire may be formed concurrently with the first capacitor electrode and the gate electrode, and the second wire may be formed concurrently with the second capacitor electrode and the source and drain electrodes.

According to one or more embodiments of the present invention, a method of manufacturing an organic light emitting display apparatus, includes (a) forming a first capacitor electrode and a gate electrode on a substrate having a first region and a second region, so that the first capacitor electrode is formed to correspond to the first region and the gate electrode is formed in a portion of the second region, the first capacitor electrode and the gate electrode being formed in a same layer; (b) forming an interlayer insulating layer to cover the gate electrode and the first capacitor electrode; and (c) etching a portion of the interlayer insulating layer in the first region by using a halftone mask to a thickness that is less than a thickness of the portion of the interlayer insulating layer in the second region; (d) forming a second capacitor electrode and source and drain electrodes on the interlayer insulating layer so that the second capacitor electrode is formed to correspond to the first region and the source and drain electrodes form a thin film transistor (TFT) together with the gate electrode; and (e) forming a pixel electrode electrically coupled to one of the source and drain electrodes.

In one embodiment, (a) may include forming a first wire on the substrate, the first wire being formed in the same layer as the gate electrode, and (d) may include forming a second wire on a portion of the interlayer insulating layer in the second region.

The first wire may be formed concurrently with the first capacitor electrode and the gate electrode, and the second wire may be formed concurrently with the second capacitor electrode and the source and drain electrodes.

In another embodiment, (a) may include forming a patterned semiconductor layer and a gate insulating layer covering the semiconductor layer on the substrate, and then forming the first capacitor electrode and the gate electrode on the gate insulating layer.

In this embodiment, (c) may include (c1) forming a photoresist layer on the interlayer insulating layer by using a halftone mask so that a thickness of a portion of the photoresist layer corresponding to the first region is less than a thickness of a portion of the photoresist layer corresponding to the second region, the photoresist layer having two exposure holes in portions of the photoresist layer corresponding to the second region to expose portions of the interlayer insulating layer corresponding to the semiconductor layer; (c2) etching the portions of the interlayer insulating layer which are exposed by the exposure holes of the photoresist layer by a first dry etching to form holes in the interlayer insulating layer; (c3) removing the portion of the photoresist layer corresponding to the first region by ashing the photoresist layer to expose a portion of the interlayer insulating layer corresponding to the first region; (c4) etching the portions of the interlayer insulating layer which are exposed by the exposure holes of the photoresist layer by a second dry etching so that portions of the semiconductor layer are exposed by the holes formed in the interlayer insulating layer and the gate insulating layer, and concurrently etching a part of the portion of the interlayer insulating layer corresponding to the first region, to a thickness that is less than the thickness of the portion of the interlayer insulating layer corresponding to the second region; and (c5) removing the photoresist layer that remains on the interlayer insulating layer.

(d) may further include forming the source and drain electrodes on the interlayer insulating layer so that the source and drain electrodes contact the semiconductor layer through the holes formed in the interlayer insulating layer and the gate insulating layer.

In this embodiment, (a) may further include forming a first wire on the substrate, the first wire being formed in the same layer as the gate electrode, and (d) may further include forming a second wire on a portion of the interlayer insulating layer in the second region.

The first wire may be formed concurrently with the first capacitor electrode and the gate electrode, and the second wire may be formed concurrently with the second capacitor electrode and the source and drain electrodes.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
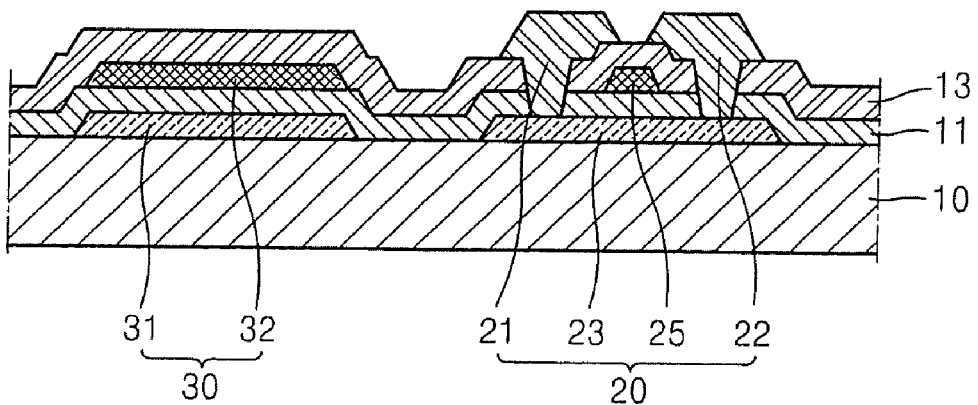
FIG. 1 is a schematic cross-sectional diagram of a thin film transistor (TFT) substrate manufactured according to a conventional TFT substrate manufacturing method.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

Figure 2:
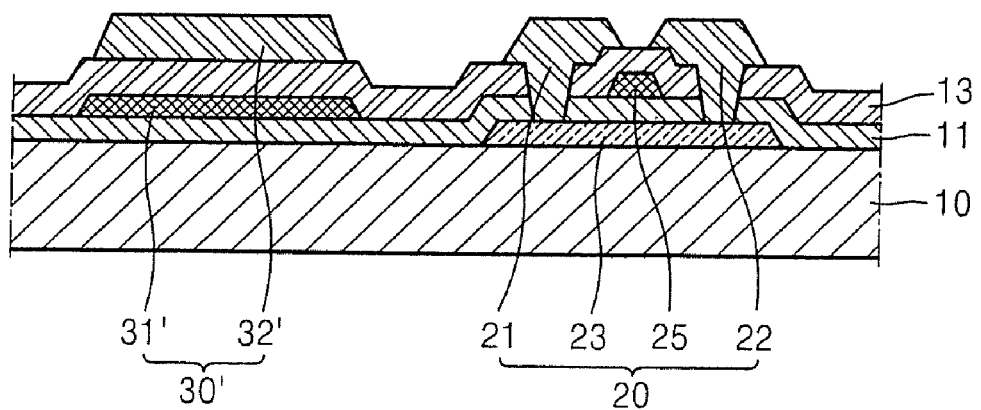
FIG. 2 is a schematic cross-sectional diagram of a TFT substrate manufactured according to a comparative TFT substrate manufacturing method.

FIG. 2 is a schematic cross-sectional diagram of a thin film transistor (TFT) substrate manufactured according to a comparative TFT substrate manufacturing method.

Referring to FIG. 2, in order to solve the problem described above with reference to FIG. 1, a first capacitor electrode 31' of a capacitor 30' and a gate electrode 25 of a TFT 20 may be formed in a same layer by using the same material, and a second capacitor electrode 32' of the capacitor 30' and source and drain electrodes 21 and 22 of the TFT 20 may be formed in a same layer by using the same material. However, in general, the capacitance of a capacitor in a metal-insulator-metal (MIM) structure as illustrated in FIG. 2 is less than that in a metal-oxide-semiconductor (MOS) structure as illustrated in FIG. 1. Thus, if the capacitor 30' illustrated in FIG. 2 is used, the thickness of an interlayer insulating layer 13 formed between the first and second capacitor electrodes 31' and 32' needs to be reduced in order to ensure sufficient capacitance.

FIG. 2 illustrates only a portion of the TFT substrate and various wires are formed at edges of the TFT substrate. One of the wires, i.e., a first wire, is formed in the same layer as the first capacitor electrode 31' while another one of the wires, i.e., a second wire, is formed in the same layer as the second capacitor electrode 32'. Thus, in order to increase the capacitance of the capacitor 30', as the thickness of the portion of the interlayer insulating layer 13 between the first and second capacitor electrodes 31' and 32' is reduced, the thickness of the portion of the interlayer insulating layer 13 between the first and second wires is also reduced and thus, defects such as short circuits may occur between the first and second wires during or after a manufacturing process. Accordingly, the thickness of the interlayer insulating layer 13 between the first and second capacitor electrodes 31' and 32' should not be reduced uniformly.

Figure 3:
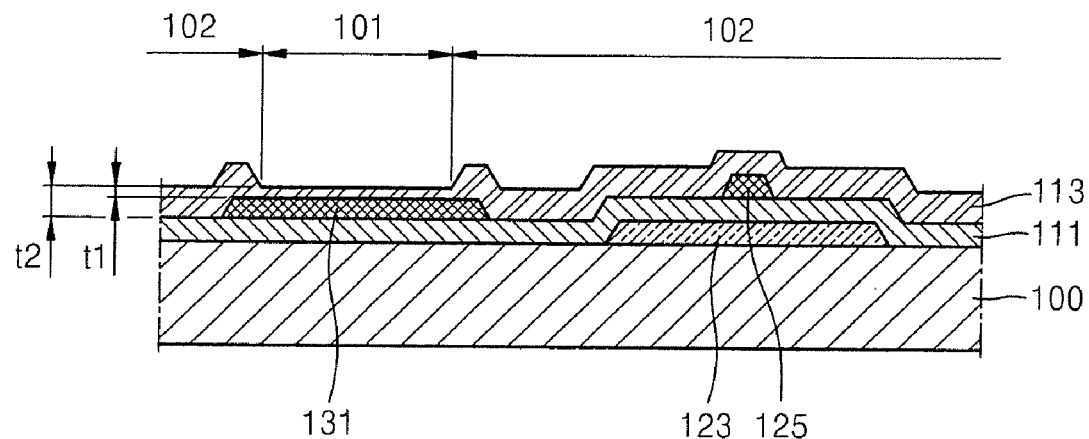
FIGS. 3 and 4 are schematic cross-sectional diagrams for describing a method of manufacturing a TFT substrate, according to an embodiment of the present invention.
Figure 4:
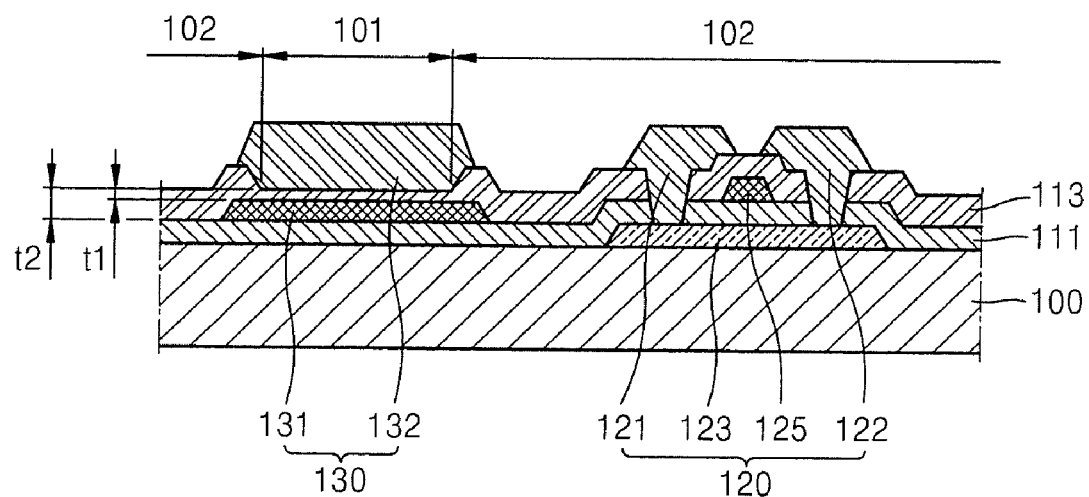

FIGS. 3 and 4 are schematic cross-sectional diagrams for describing a method of manufacturing a TFT substrate, according to an embodiment of the present invention.

Referring to FIG. 3, a first capacitor electrode 131 and a gate electrode 125 are formed in a same layer on a substrate 100 having a first region 101 and a second region 102, so that the first capacitor electrode 131 is formed to correspond to the first region 101 and the gate electrode 125 is formed in a portion of the second region 102. Selectively, a patterned semiconductor layer 123 and a gate insulating layer 111 covering the semiconductor layer 123 may be formed on the substrate 100 and then the first capacitor electrode 131 and the gate electrode 125 may be formed on the gate insulating layer 111. The forming order may be changed according to a correlation between the positions of the gate electrode 125 and the patterned semiconductor layer 123 in a TFT.

The substrate 100 may be formed of various plastic materials such as acryl, as well as a glass material. The patterned semiconductor layer 123 may be formed of amorphous silicon or polycrystalline silicon and may also be formed of an organic semiconductor material or an oxide semiconductor material. The gate insulating layer 111 may be formed of an insulating material such as silicon oxide or silicon nitride. The first capacitor electrode 131 and the gate electrode 125 may be formed on the gate insulating layer 111 by forming a conductive layer on the entire top surface of the substrate 100 and patterning the conductive layer, or by depositing a conductive material on regions using a mask. The first capacitor electrode 131 is formed to correspond to the first region 101 and the gate electrode 125 is formed in a portion of the second region 102. In more detail, the gate electrode 125 may be formed to correspond to the semiconductor layer 123. The first capacitor electrode 131 and the gate electrode 125 may be formed of various conductive materials such as molybdenum (Mo), tungsten (W), aluminum (Al), titanium (Ti), copper (Cu), silver (Ag), and/or alloys thereof.

Then, an interlayer insulating layer 113 is formed by using an insulating material such as silicon oxide and/or silicon nitride to cover the gate electrode 125 and the first capacitor electrode 131. Then, a portion of the interlayer insulating layer 113 corresponding to the first region 101 is etched to a thickness t1 that is less than a thickness t2 of a portion of the interlayer insulating layer 113 in the second region 102.

Then, referring to FIG. 4, a second capacitor electrode 132 and source and drain electrodes 121 and 122 are formed on the interlayer insulating layer 113. In this case, the second capacitor electrode 132 is formed to correspond to the first region 101 and forms a capacitor 130 together with the first capacitor electrode 131 in the first region 101 while the source and drain electrodes 121 and 122 form a TFT 120 together with the gate electrode 125 in the second region 102. The second capacitor electrode 132 and the source and drain electrodes 121 and 122 may be formed of various conductive materials such as Ag, magnesium (Mg), Al, platinum (Pt), palladium (Pd), gold (Au), nickel (Ni), neodymium (Nd), iridium (Ir), chromium (Cr), and/or alloys thereof.

As such, the TFT substrate in which the capacitor 130 and the TFT 120 are formed as illustrated in FIG. 4 may be manufactured. In particular, the capacitance of the capacitor 130 may be greatly increased by lowering the thickness of the interlayer insulating layer 113 between the first and second capacitor electrodes 131 and 132 of the capacitor 130 to the thickness t1 in the first region 101 that is less than the thickness t2 of the interlayer insulating layer 113 in other regions.

When the first capacitor electrode 131 and the gate electrode 125 are formed, a first wire (not shown) may be concurrently formed on the substrate 100. The first wire may be formed in the same layer as the gate electrode 125. Also, when the second capacitor electrode 132 and the source and drain electrodes 121 and 122 are formed, a second wire (not shown) may be concurrently formed on the interlayer insulating layer 113 in the second region 102. The first and second wires may cross each other at different levels, and the interlayer insulating layer 113 is disposed between the first and second wires. In this case, since the first and second wires cross each other in the second region 102 and the thickness t2 of the interlayer insulating layer 113 in the second region 102 is greater than the thickness t1 of the interlayer insulating layer 113 in the first region 101, the probability of causing defects such as short circuits between the first and second wires during or after a manufacturing process can be greatly reduced.

FIGS. 5A through 5E are schematic cross-sectional diagrams for describing a method of manufacturing a TFT substrate, according to another embodiment of the present invention.

Figure 5A:
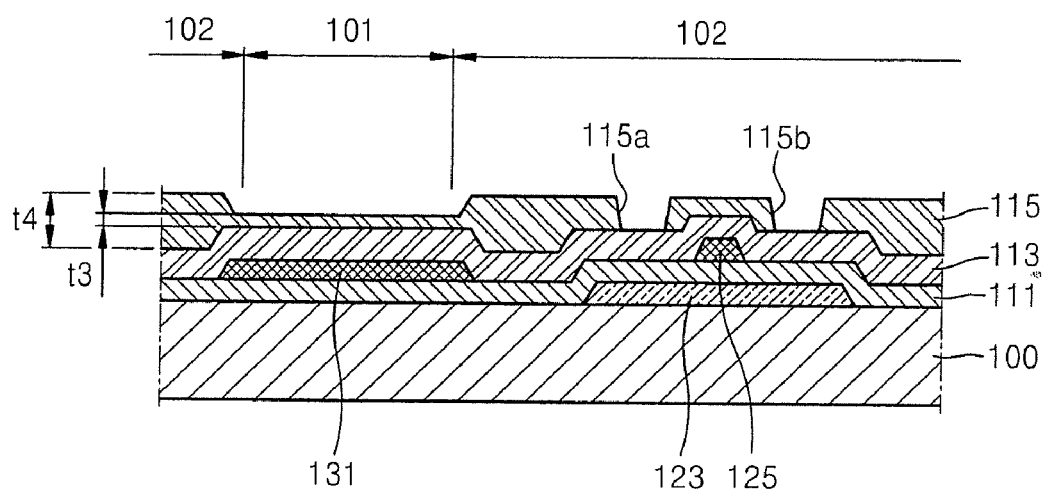
FIGS. 5A through 5E are schematic cross-sectional diagrams for describing a method of manufacturing a TFT substrate, according to another embodiment of the present invention.

Referring to FIG. 5A, a first capacitor electrode 131 and a gate electrode 125 are formed on a substrate 100 having a first region 101 and a second region 102, so that the first capacitor electrode 131 is formed to correspond to the first region 101 and the gate electrode 125 is formed in a portion of the second region 102. The first capacitor electrode 131 and the gate electrode 125 are formed in a same layer. Selectively, a patterned semiconductor layer 123 and a gate insulating layer 111 covering the semiconductor layer 123 may be formed on the substrate 100 and then the first capacitor electrode 131 and the gate electrode 125 may be formed on the gate insulating layer 111. The forming order may be changed according to a correlation between the positions of the gate electrode 125 and the semiconductor layer 123 in a TFT.

The first capacitor electrode 131 and the gate electrode 125 may be formed on the gate insulating layer 111 by forming a conductive layer on the entire top surface of the substrate 100 and patterning the conductive layer, or by depositing a conductive material on regions using a mask. The first capacitor electrode 131 is formed to correspond to the first region 101 and the gate electrode 125 is formed in a portion of the second region 102. In more detail, the gate electrode 125 may be formed to correspond to the semiconductor layer 123.

Then, an interlayer insulating layer 113 is formed by using an insulating material such as silicon oxide and/or silicon nitride to cover the gate electrode 125 and the first capacitor electrode 131 and, as illustrated in FIG. 5A, a photoresist layer 115 is formed on the interlayer insulating layer 113. When the photoresist layer 115 is formed, a portion of the photoresist layer 115 corresponding to the first region 101 is formed to have a thickness t3 that is less than a thickness t4 of a portion of the photoresist layer 115 in the second region 102, by using a halftone mask. In this case, two exposure holes 115a and 115b are formed in the portion of the photoresist layer 115 in the second region 102, to expose portions of the interlayer insulating layer 113, which correspond to the semiconductor layer 123.

Figure 5B:
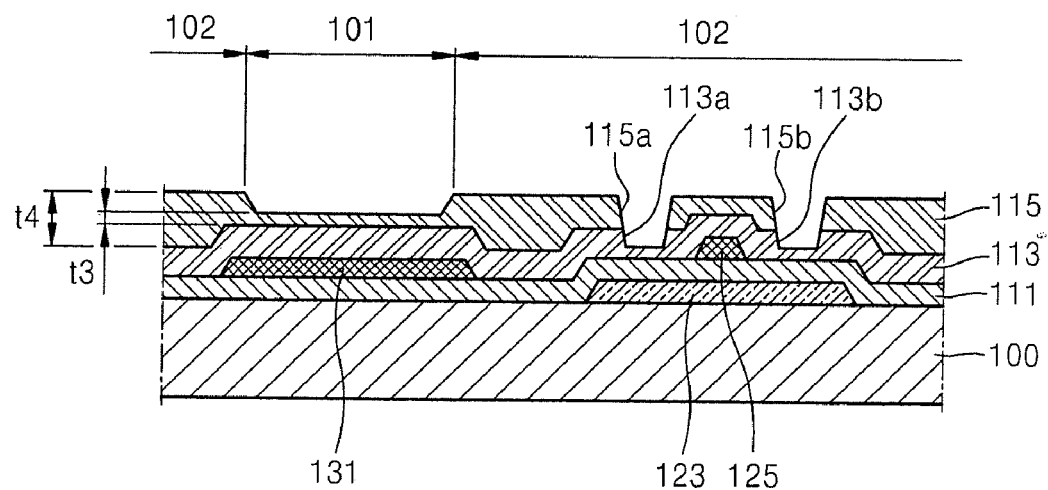

Then, referring to FIG. 5B, the portions of the interlayer insulating layer 113, which are exposed by the exposure holes 115a and 115b of the photoresist layer 115, are primarily etched by a first dry etching to form holes 113a and 113b in the interlayer insulating layer 113. In this case, only a portion of the interlayer insulating layer 113 is etched so that the gate insulating layer 111 is not exposed.

Figure 5C:
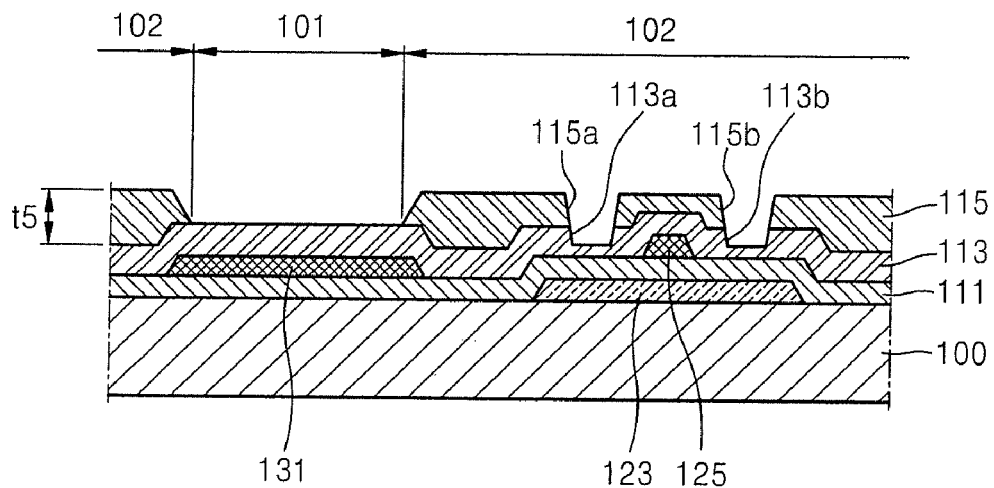

Then, the photoresist layer 115 is ashed as illustrated in FIG. 5C. In more detail, the portion of the photoresist layer 115 corresponding to the first region 101 is removed by ashing the photoresist layer 115 to expose the portion of the interlayer insulating layer 113 in the first region 101. As such, the thickness t4 of the photoresist layer 115 in the second region 102 is also reduced to a thickness t5.

Figure 5D:
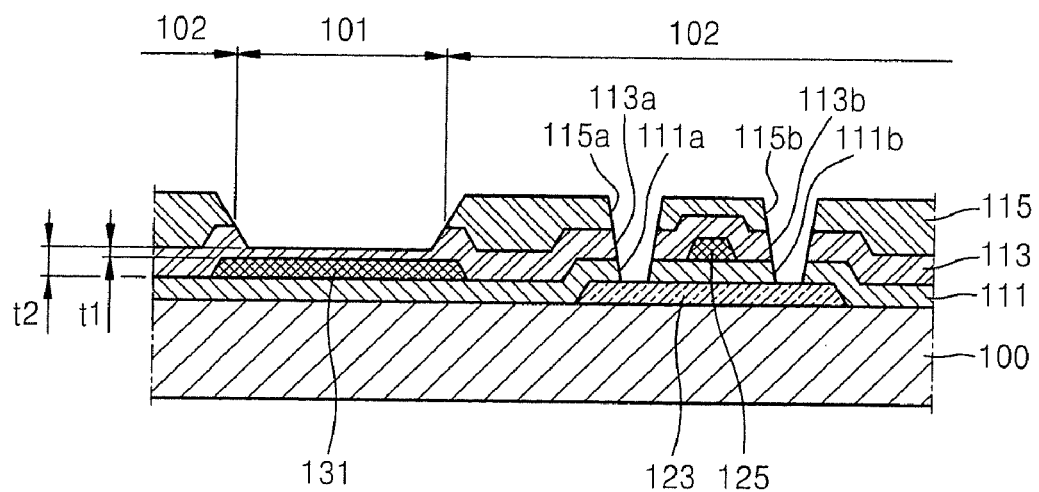

Then, referring to FIG. 5D, the portions of the interlayer insulating layer 113 which are exposed by the exposure holes 115a and 115b of the photoresist layer 115 are secondarily etched by a second dry etching so that the semiconductor layer 123 is exposed through the gate insulating layer 111. In more detail, due to the second dry etching, portions of the semiconductor layer 123 are exposed by the holes 113a and 113b formed in the interlayer insulating layer 113 and holes 111a and 111b formed in the gate insulating layer 111. Concurrently, by performing the second dry etching method, a part of the portion of the interlayer insulating layer 113 in the first region 101, is etched to a thickness t1 that is less than a thickness t2 of a portion of the interlayer insulating layer 113 in the second region 102.

Figure 5E:
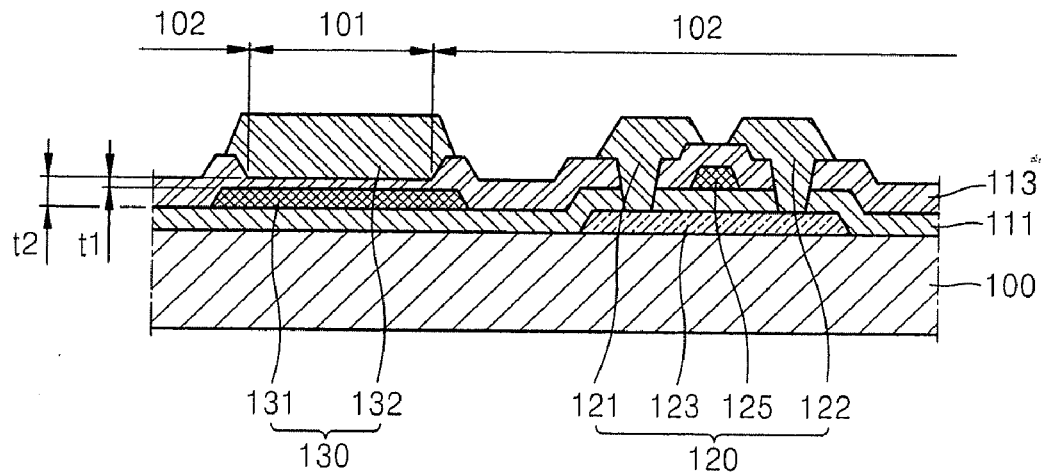

Then, referring to FIG. 5E, the photoresist layer 115 that remains on the interlayer insulating layer 113 is removed and a second capacitor electrode 132 and source and drain electrodes 121 and 122 are formed on the interlayer insulating layer 113. In this case, the second capacitor electrode 132 is formed to correspond to the first region 101 and forms a capacitor 130 together with the first capacitor electrode 131 in the first region 101. In addition, the source and drain electrodes 121 and 122 form a TFT 120 together with the gate electrode 125 in the second region 102 and contact the semiconductor layer 123 through the holes 113a and 113b formed in the interlayer insulating layer 113 and the holes 111a and 111b formed in the gate insulating layer 111.

As such, the TFT substrate in which the capacitor 130 and the TFT 120 are formed as illustrated in FIG. 5E can be manufactured. In particular, the capacitance of the capacitor 130 may be greatly increased by etching the interlayer insulating layer 113 between the first and second capacitor electrodes 131 and 132 of the capacitor 130 to the thickness t1 in the first region 101 that is less than the thickness t2 of the interlayer insulating layer 113 in other regions.

When the first capacitor electrode 131 and the gate electrode 125 are formed, a first wire (not shown) may be concurrently formed on the substrate 100. The first wire may be formed in the same layer as the gate electrode 125. Also, when the second capacitor electrode 132 and the source and drain electrodes 121 and 122 are formed, a second wire (not shown) may be concurrently formed on the interlayer insulating layer 113 in the second region 102. The first and second wires may cross each other at different levels, and the interlayer insulating layer 113 is disposed between the first and second wires. In this case, since the first and second wires cross each other in the second region 102 and the thickness t2 of the interlayer insulating layer 113 in the second region 102 is greater than the thickness t1 of the interlayer insulating layer 113 in the first region 101, the probability of causing defects such as short circuits between the first and second wires during or after a manufacturing process can be greatly reduced.

Figure 6:
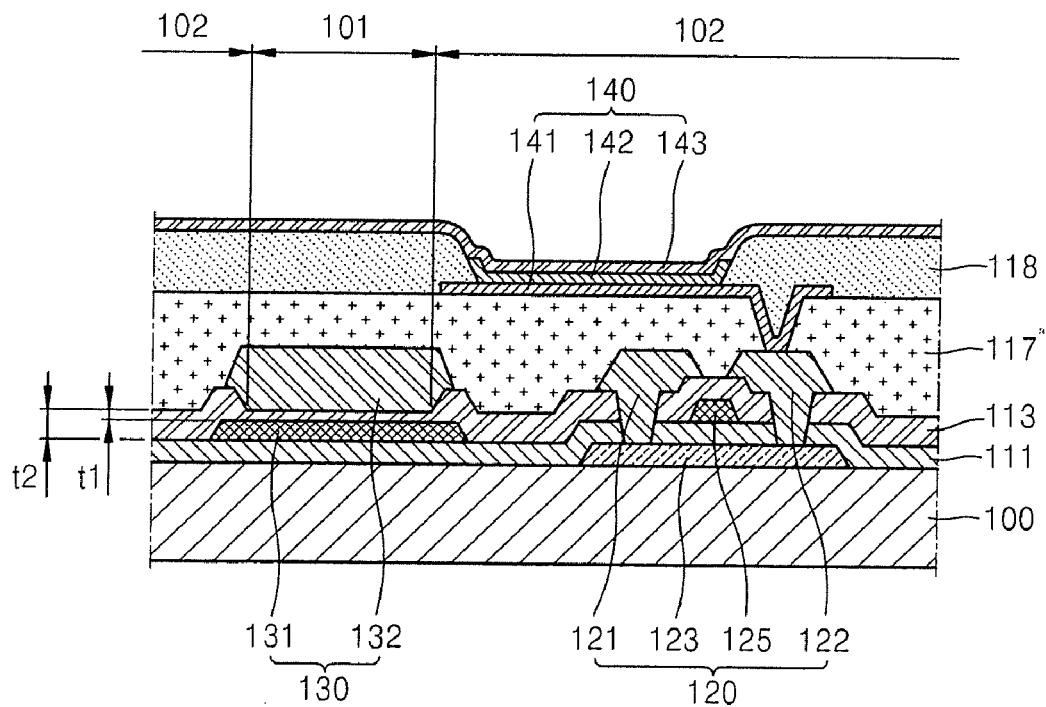
FIG. 6 is a schematic cross-sectional diagram of an organic light emitting display apparatus manufactured by using a method of manufacturing the organic light emitting display apparatus, according to an embodiment of the present invention.

FIG. 6 is a schematic cross-sectional diagram of an organic light emitting display apparatus manufactured by using a method of manufacturing the organic light emitting display apparatus, according to an embodiment of the present invention.

Referring to FIG. 6, initially, a TFT substrate having a capacitor 130 and a TFT 120 is manufactured as described above with reference to FIGS. 3 and 4 or FIGS. 5A through 5E. Then, a pixel electrode 141 is formed to be electrically coupled to one of source and drain electrodes 121 and 122. Selectively, before forming the pixel electrode 141, a planarization layer 117 may be formed by using, for example, acryl to cover the capacitor 130 and the TFT 120. However, the planarization layer 117 may be variously formed or replaced with other layers. For example, the planarization layer 117 may instead be a passivation layer, or it may be formed of silicon oxide or silicon nitride instead of acryl, or it may have a multi-layer structure instead of a single-layer structure.

The pixel electrode 141 may be a transparent electrode or a reflective electrode. The transparent electrode may be formed of indium tin oxide (ITO), indium zinc oxide (IZO), zinc oxide (ZnO), or indium oxide ($In_2O_3$), and the reflective electrode may be formed by combining a reflective layer formed of Ag, Mg, Al, Pt, Pd, Au, Ni, Nd, Ir, Cr, or an alloy thereof and a transparent layer formed of ITO, IZO, ZnO, or $In_2O_3$. However, the present invention is not limited thereto and the pixel electrode 141 may be variously formed. For example, the pixel electrode 141 may be formed of various materials in addition to the above-mentioned materials and may have a single-layer structure or a multi-layer structure. In FIG. 6, the pixel electrode 141 is electrically connected to the drain electrode 122 through a via hole formed in the planarization layer 117.

Then, a pixel defining layer 118 is formed. The pixel defining layer 118 defines a pixel by having an aperture for exposing a center portion of or the entire pixel electrode 141. The pixel defining layer 118 may be formed of an organic material such as polyimide or an inorganic material such as silicon oxide or silicon nitride.

Then, an intermediate layer 142 is formed on the pixel electrode 141 by using a low-molecular weight material or a polymer material. If the low-molecular weight material is used, the intermediate layer 142 may have a structure including at least one of the group consisting of a hole injection layer (HIL), a hole transport layer (HTL), an emission layer (EML), an electron transport layer (ETL), and an electron injection layer (EIL). The intermediate layer 142 may be formed of various organic materials such as copper phthalocyanine (CuPc), N,N'-Di(naphthalene-1-yl)-N,N'-diphenyl-benzidine (NPB), and tris-8-hydroxyquinoline aluminum (Alq3) by using, for example, a vacuum deposition method.

If the polymer material is used, the intermediate layer 142 may have a structure including an HTL and an EML. In this case, the HTL may be formed of poly-3,4-ethylendioxythiophene (PEDOT) and the EML may be formed of a polyphenylenevinylene (PPV)-based or polyfluorene-based polymer material, by using, for example, a screen printing method or an inkjet printing method. However, the structure of the intermediate layer 142 is not limited thereto and may be variously formed.

Then, a counter electrode 143 is formed on the intermediate layer 142 and the pixel defining layer 118, thereby completing the manufacture of an organic light emitting diode (OLED) 140 including the pixel electrode 141, the intermediate layer 142, and the counter electrode 143. The counter electrode 143 may be a transparent electrode or a reflective electrode. The transparent electrode may be formed by combining a layer formed of metal having a low work function, such as lithium (Li), calcium (Ca), LiF/Ca, LiF/Al, Al, Ag, Mg, or an alloy thereof and a transparent conductive layer formed of ITO, IZO, ZnO, or $In_2O_3$. The reflective electrode may be formed of Li, Ca, LiF/Ca, LiF/Al, Al, Ag, or Mg. However, the structure and material of the counter electrode 143 is not limited thereto and may be variously formed.

In the above-described organic light emitting display apparatus, as the OLED 140 of each pixel is electrically connected to the TFT 120 and the capacitor 130, which are formed under the OLED 140, the capacitance of the capacitor 130 may be greatly increased and emission of the OLED 140 may be easily controlled.

During the manufacture of the organic light emitting display apparatus, when a first capacitor electrode 131 and a gate electrode 125 are formed, a first wire (not shown) may be concurrently formed on a substrate 100. The first wire may be formed in a same layer as the gate electrode 125. Also, when a second capacitor electrode 132 and the source and drain electrodes 121 and 122 are formed, a second wire (not shown) may be concurrently formed on an interlayer insulating layer 113 in a second region 102. The first and second wires may cross each other at different levels, and the interlayer insulating layer 113 is formed between the first and second wires. In this case, since the first and second wires cross each other in the second region 102 and a thickness t2 of the interlayer insulating layer 113 in the second region 102 is greater than a thickness t1 of the interlayer insulating layer 113 in a first region 101, the probability of causing defects such as short circuits between the first and second wires during or after a manufacturing process can be greatly reduced.

As described above, according to the one or more of the above embodiments of the present invention, the capacitance of a capacitor may be increased without increasing the probability of short circuits between wires.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A method of manufacturing a thin film transistor (TFT) substrate having a TFT and a capacitor, the method comprising:
    (a) forming a lowest capacitor electrode and a gate electrode on a substrate having a first region and a second region, so that the lowest capacitor electrode is formed to correspond to the first region and the gate electrode is formed in a portion of the second region, the lowest capacitor electrode and the gate electrode being formed in a same layer;
    (b) forming an interlayer insulating layer to cover the gate electrode and the lowest capacitor electrode;
    (c) etching a portion of the interlayer insulating layer in the first region by using a halftone mask to a thickness that is less than a thickness of a portion of the interlayer insulating layer in the second region; and
    (d) forming a second capacitor electrode and source and drain electrodes on the interlayer insulating layer so that the second capacitor electrode is formed to correspond to the first region and the source and drain electrodes form the TFT together with the gate electrode,
    wherein (a) comprises forming a first wire on the substrate, the first wire being formed in the same layer as the gate electrode, and
    wherein (d) comprises forming a second wire on a portion of the interlayer insulating layer in the second region.

2. The method of claim 1,
    wherein the first wire is formed concurrently with the lowest capacitor electrode and the gate electrode, and
    wherein the second wire is formed concurrently with the second capacitor electrode and the source and drain electrodes.

3. A method of manufacturing a thin film transistor (TFT) substrate having a TFT and a capacitor, the method comprising:
    (a) forming a lowest capacitor electrode and a gate electrode on a substrate having a first region and a second region, so that the lowest capacitor electrode is formed to correspond to the first region and the gate electrode is formed in a portion of the second region, the lowest capacitor electrode and the gate electrode being formed in a same layer;
    (b) forming an interlayer insulating layer to cover the gate electrode and the lowest capacitor electrode
    (c) etching a portion of the interlayer insulating layer in the first region by using a halftone mask to a thickness that is less than a thickness of a portion of the interlayer insulating layer in the second region; and
    (d) forming a second capacitor electrode and source and drain electrodes on the interlayer insulating layer so that the second capacitor electrode is formed to correspond to the first region and the source and drain electrodes form the TFT together with the gate electrode,
    wherein (a) comprises forming a patterned semiconductor layer and a gate insulating layer covering the semiconductor layer on the substrate, and then forming the lowest capacitor electrode and the gate electrode on the gate insulating layer,
    wherein (a) further comprises forming a first wire on the substrate, the first wire being formed in the same layer as the gate electrode, and
    wherein (d) comprises forming a second wire on a portion of the interlayer insulating layer in the second region.

4. The method of claim 3,
    wherein the first wire is formed concurrently with the lowest capacitor electrode and the gate electrode, and wherein the second wire is formed concurrently with the second capacitor electrode and the source and drain electrodes.

5. The method of claim 3, wherein (c) comprises:
(c1) forming a photoresist layer on the interlayer insulating layer by using a halftone mask so that a thickness of a portion of the photoresist layer corresponding to the first region is less than a thickness of a portion of the photoresist layer corresponding to the second region, the photoresist layer having two exposure holes in the portion of the photoresist layer corresponding to the second region to expose portions of the interlayer insulating layer corresponding to the semiconductor layer;
(c2) etching the portions of the interlayer insulating layer which are exposed by the exposure holes of the photoresist layer by a first dry etching to form holes in the interlayer insulating layer;
(c3) removing the portion of the photoresist layer corresponding to the first region by ashing the photoresist layer to expose a portion of the interlayer insulating layer corresponding to the first region; and
(c4) etching the portions of the interlayer insulating layer which are exposed by the exposure holes of the photoresist layer by a second dry etching so that portions of the semiconductor layer are exposed by the holes formed in the interlayer insulating layer and the gate insulating layer, and concurrently etching a part of the portion of the interlayer insulating layer corresponding to the first region, to a thickness that is less than the thickness of the portion of the interlayer insulating layer corresponding to the second region.

6. The method of claim 5, further comprising:
(c5) removing the photoresist layer that remains on the interlayer insulating layer,
wherein in (d), the source and drain electrodes contact the semiconductor layer through the holes formed in the interlayer insulating layer and the gate insulating layer.

7. The method of claim 6,
wherein the first wire is formed concurrently with the lowest capacitor electrode and the gate electrode, and
wherein the second wire is formed concurrently with the second capacitor electrode and the source and drain electrodes.

8. A method of manufacturing an organic light emitting display apparatus, the method comprising:
(a) forming a lowest capacitor electrode and a gate electrode on a substrate having a first region and a second region, so that the lowest capacitor electrode is formed to correspond to the first region and the gate electrode is formed in a portion of the second region, the lowest capacitor electrode and the gate electrode being formed in a same layer;
(b) forming an interlayer insulating layer to cover the gate electrode and the lowest capacitor electrode;
(c) etching a portion of the interlayer insulating layer in the first region by using a halftone mask to a thickness that is less than a thickness of a portion of the interlayer insulating layer in the second region;
(d) forming a second capacitor electrode and source and drain electrodes on the interlayer insulating layer so that the second capacitor electrode is formed to correspond to the first region and the source and drain electrodes form a thin film transistor (TFT) together with the gate electrode; and
(e) forming a pixel electrode electrically coupled to one of the source and drain electrodes,
wherein (a) comprises forming a first wire on the substrate, the first wire being formed in the same layer as the gate electrode, and
wherein (d) comprises forming a second wire on a portion of the interlayer insulating layer in the second region.

9. The method of claim 8,
wherein the first wire is formed concurrently with the lowest capacitor electrode and the gate electrode, and
wherein the second wire is formed concurrently with the second capacitor electrode and the source and drain electrodes.

10. The method of claim 8, wherein (a) further comprises forming a patterned semiconductor layer and a gate insulating layer covering the semiconductor layer on the substrate, and then forming the lowest capacitor electrode and the gate electrode on the gate insulating layer.

11. The method of claim 10, wherein (c) comprises:
(c1) forming a photoresist layer on the interlayer insulating layer by using a halftone mask so that a thickness of a portion of the photoresist layer corresponding to the first region is less than a thickness of a portion of the photoresist layer corresponding to the second region, the photoresist layer having two exposure holes in portions of the photoresist layer corresponding to the second region to expose portions of the interlayer insulating layer corresponding to the semiconductor layer;
(c2) etching the portions of the interlayer insulating layer which are exposed by the exposure holes of the photoresist layer by a first dry etching to form holes in the interlayer insulating layer;
(c3) removing the portion of the photoresist layer corresponding to the first region by ashing the photoresist layer to expose a portion of the interlayer insulating layer corresponding to the first region;
(c4) etching the portions of the interlayer insulating layer which are exposed by the exposure holes of the photoresist layer by a second dry etching so that portions of the semiconductor layer are exposed by the holes formed in the interlayer insulating layer and the gate insulating layer, and concurrently etching a part of the portion of the interlayer insulating layer corresponding to the first region, to a thickness that is less than the thickness of the portion of the interlayer insulating layer corresponding to the second region; and
(c5) removing the photoresist layer that remains on the interlayer insulating layer.

12. The method of claim 11, wherein in (d), the source and drain electrodes contact the semiconductor layer through the holes formed in the interlayer insulating layer and the gate insulating layer.

13. The method of claim 12,
wherein the first wire is formed concurrently with the lowest capacitor electrode and the gate electrode, and
wherein the second wire is formed concurrently with the second capacitor electrode and the source and drain electrodes.

* * * * *